United States Patent
Jagannathan et al.

(10) Patent No.: US 10,700,691 B1
(45) Date of Patent: Jun. 30, 2020

(54) CIRCUIT WITH ANALOG-TO-DIGITAL CONVERTERS OF DIFFERENT CONVERSION RESOLUTIONS

(71) Applicant: NXP USA, INC., Austin, TX (US)

(72) Inventors: Srikanth Jagannathan, Austin, TX (US); Christopher James Micielli, Royal Oak, MI (US); George Rogers Kunnen, Chandler, AZ (US); Carl Culshaw, Wigan (GB)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/426,282

(22) Filed: May 30, 2019

(51) Int. Cl.
H03M 1/38 (2006.01)
H03M 1/00 (2006.01)
H03M 1/46 (2006.01)
H03M 1/14 (2006.01)

(52) U.S. Cl.
CPC ........... *H03M 1/002* (2013.01); *H03M 1/007* (2013.01); *H03M 1/144* (2013.01); *H03M 1/468* (2013.01)

(58) Field of Classification Search
CPC ...... H03M 1/002; H03M 1/144; H03M 1/468; H03M 1/007; H03M 1/12; H03M 1/00
USPC .................................. 341/161, 155
See application file for complete search history.

(56) References Cited

U.S. PATENT DOCUMENTS

| | | | |
|---|---|---|---|
| 5,675,337 A * | 10/1997 | Moriyama | H03M 1/12 341/141 |
| 6,958,722 B1 | 10/2005 | Janakiraman et al. | |
| 7,310,058 B2 | 12/2007 | Udupa et al. | |
| 7,522,082 B2 * | 4/2009 | Asayama | H03M 1/0863 341/144 |
| 7,839,319 B2 | 11/2010 | Nittala et al. | |
| 8,487,805 B1 | 7/2013 | Gupta et al. | |
| 8,810,444 B2 * | 8/2014 | Hwang | H03M 1/20 341/155 |
| 2008/0252243 A1 * | 10/2008 | Azuma | H03K 7/08 318/400.17 |
| 2011/0105097 A1 * | 5/2011 | Tadayon | H04W 4/50 455/418 |
| 2011/0109488 A1 * | 5/2011 | Nakajima | H03M 1/1004 341/120 |
| 2013/0102264 A1 * | 4/2013 | Nakane | H03M 1/1004 455/130 |
| 2014/0333459 A1 * | 11/2014 | Oshima | H03M 1/1033 341/120 |
| 2015/0138007 A1 * | 5/2015 | Shiraishi | H03M 1/1245 341/156 |

* cited by examiner

*Primary Examiner* — Jean B Jeanglaude
(74) *Attorney, Agent, or Firm* — David G. Dolezal; Joanna G. Geld

(57) ABSTRACT

A circuit includes a first external terminal, a first lower resolution analog-to-digital converter (LRADC) coupled to the external terminal and configured to perform a first conversion of an analog signal received at the external terminal to a digital value, and a higher resolution analog-to-digital converter (HRADC). The HRADC is configured to selectively receive the analog signal from the first external terminal based on the digital value. When the digital value outputted by the first LRADC indicates a change in value of the received analog signal, the HRADC is provided with the analog signal and performs a second conversion of the analog signal to a second digital value. The first LRADC has a lower conversion resolution as compared to the HRADC.

20 Claims, 5 Drawing Sheets

US 10,700,691 B1

CIRCUIT WITH ANALOG-TO-DIGITAL CONVERTERS OF DIFFERENT CONVERSION RESOLUTIONS

BACKGROUND OF THE INVENTION

Field of the Invention

This invention relates in general to a circuit with analog-to-digital converters of different conversion resolutions.

Background

Analog-to-digital converters (ADCs) are used in electronic systems to convert an analog voltage to a digital representation of the analog voltage.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a circuit includes a lower resolution ADC and a higher resolution ADC for providing a digital representation of an analog signal received at an external terminal (e.g. pad) of an integrated circuit. In some examples, if the digital value of the lower resolution ADC indicates that an analog signal at the pad has changed, the analog signal is then provided to the higher resolution ADC to provide a digital value with a higher conversion resolution.

Providing a system with two ADCs of different conversion resolutions may allow for reduced power consumption in that the lower resolution ADC (which is typically a lower power ADC) is used to monitor the analog signal, and if it indicates a change in the status of the signal, the analog signal is provided to the higher resolution ADC to generate a higher conversion resolution of the signal. Otherwise, the higher resolution ADC is not used for converting the signal, thereby saving power. In other embodiments, by using the higher resolution ADC to obtain a higher resolution digital value only when there is a change in the analog signal may allow for the higher resolution ADC to efficiently handle high speed analog signals that require a higher usage of ADC resources thereby increasing the bandwidth of the system and reducing the amount of circuitry of a system.

Figure 1:
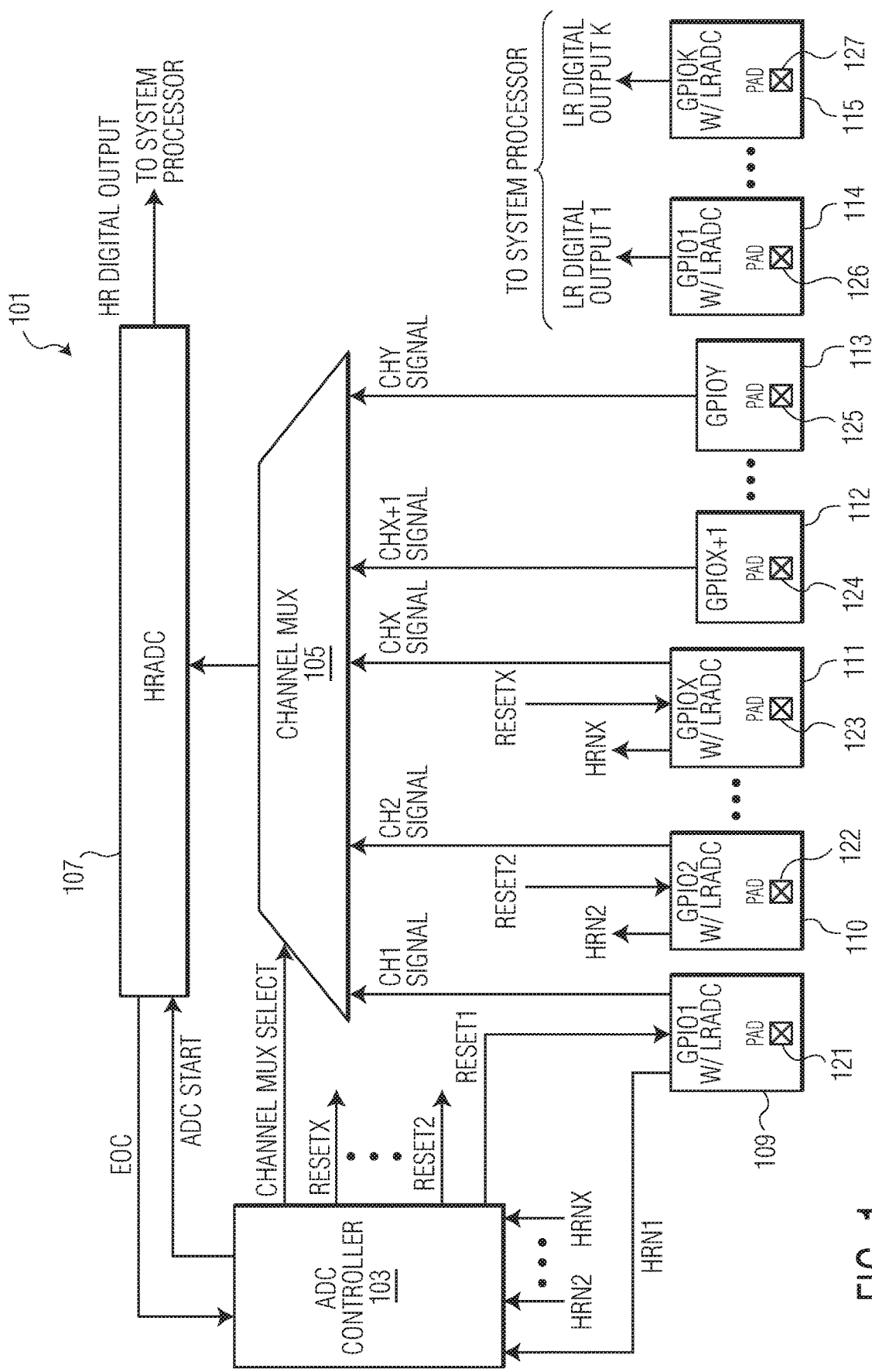
FIG. 1 is a circuit diagram of an I/O circuitry and ADC circuitry according to one embodiment of the present invention.

FIG. 1 is a circuit diagram of an integrated circuit 101 that includes a number of I/O cells 109-115 and a higher resolution analog-to-digital converter (HRADC) 107 for providing a high conversion resolution digital value of the analog signals (CH1 SIGNAL-CHY SIGNAL) received from I/O cells 109-113. The analog signals from I/O cells 109-113 are each provided to HRADC 107 by a multiplexer (CHANNEL MUX) 105. The circuitry includes an ADC controller 103 that selects which analog signal (CH1 SIGNAL-CHY SIGNAL) is to be provided to HRADC 107 for conversion to a digital value at a particular time. In the embodiment shown, the digital output of HRADC 107 (HR DIGITAL OUTPUT) is provided to a system processor (not shown) of an integrated circuit via a data bus (not shown). In one embodiment, HRADC 107 is a successive approximation converter but may be another type of ADC in other embodiments such as a flash ADC or sigma-delta ADC. In one embodiment, HRADC 107 has a conversion resolution of 8 bits (the output produces an 8-bit digital value of the received analog signal). However, HRADC 107 may be of different conversion resolutions (e.g. 12, 16, 24, 32, 64) in other embodiments.

In the embodiment shown, each I/O cell (109-115) includes an external terminal (e.g. integrated circuit pads 121-127) and associated circuitry (e.g. buffers, passgates—not shown in FIG. 1). The external terminals are used to receive and/or provide signals between integrated circuit 101 and other integrated circuits (not shown) of the system. In some embodiments, the other integrated circuits may be located in the same IC package as integrated circuit 101 or may be located in other packages (not shown). In some embodiments, I/O cells 109-115 are programmable such that they can send and/or receive both analog and digital signals. In other embodiments, at least some of the I/O cells can receive only input signals (digital and/or analog). In some embodiments, some of the I/O cells can only provide output signals. In some embodiments, at least some of the cells only handle analog signals.

In the embodiment shown, I/O cells 109-111 and 114-115 each include a lower resolution analog-to-digital converter (LRADC) (see LRADC 211 of FIG. 2) for providing a digital value of an analog signal received by the external terminal (e.g. pads 121-123 and 126-127). In one embodiment, the LRADCs have a conversion resolution of 4 bits (the output produces a 4-bit digital value) of the received analog signal. However, the LRADCs may have different conversion resolutions in other embodiments. In one embodiment, the LRADCs are successive approximation ADCs, but may be of other types of ADCs such as flash ADCs or sigma-delta ADCs. In one embodiment, an example of an LRADC is found in U.S. patent application Ser. No. 16/275,647, filed on Feb. 14, 2019, and having a common assignee, all of which is incorporated by reference in its entirety.

In the embodiment shown, each of I/O cells 109-111 generates an indication (HRN1-X) that the value of a received analog signal has changed such that the digital value produced by the LRADC of the I/O cell has changed. These HRN signals are provided to an ADC controller 103. ADC controller 103 uses the HRN signals in selecting which analog signal from an I/O cell is provided to HRDAC 107 to produce a digital value at a higher conversion resolution.

In one embodiment, ADC controller 103 only provides the analog signal (through Chanel Mux 105) to HRADC 107 to produce a higher conversion resolution digital value when the HRN signal of the I/O cell producing the signal indicates that its value has changed. In response to an asserted HRN signal from an I/O cell, the ADC controller 103 schedules the channel for analog-to-digital (A-D) conversion by HRADC 107.

In one embodiment, each I/O cell 109-113 is characterized as part of a channel for receiving information provided to the external terminal (121-125) of its I/O cell. ADC controller 103 selects which channel's analog signal is provided to HRADC 107 for A-D conversion. In order for HRADC 107 to provide a digital value of an analog signal of a channel, ADC controller 103 selects that channel by providing on the CHANNEL MUX SELECT lines, values corresponding to the channel which select the input of mux 105 of the channel. ADC controller 103 asserts the ADC START signal to HRADC 107 to begin the A-D conversion process. When HRADC 107 completes the digital conversion of the analog signal, it asserts the EOC signal indicating that the A-D conversion process is complete. In response to receiving the EOC signal, controller 103 selects the next channel to be converted. If the converted value is for a channel from one of I/O cells 109-111, controller 103 asserts a reset signal (RESET1-X) to the corresponding I/O cell of the channel. In response, the corresponding I/O cell de-asserts its HRN signal.

In the embodiment shown, only a portion of the I/O cells (109-111) that are coupled to an input of mux 105 include LRADCs. The other I/O cells (112, 113) do not have an LRADC. In some embodiments, the analog signal from those I/O cells (112, 113) are periodically processed by the HRADC 107 regardless of whether their value has changed or not from a previous conversion. In other embodiments, all I/O cells coupled to an input of mux 105 have an LRADC.

In one embodiment, the total number (Y) of channel inputs into mux 105 is 96. However, mux 105 may have a different number of channel inputs in other embodiments. In one embodiment, the number (X) of I/O cells coupled to mux 105 that have an LRADC is 32 but may be of other numbers (up to Y) in other embodiments.

Integrated circuit 101 also includes a number of I/O cells (114, 115) that are not coupled to mux 105. Those cells also include a LRADC. In one embodiment, the outputs of those LRADCs are provided to the system processor (not shown).

In one embodiment, integrated circuit 101 is part of a monitoring system such as a monitoring system for a motor vehicle. Each I/O cell (109-115) is coupled to a different sensor that is monitored by the system (e.g. brake sensor, ADAS sensor accelerator sensor) in order for the system processor to log the information and/or to take appropriate action in response to the monitored conditions. In some embodiments, some inputs are considered less important than other inputs and therefore are monitored less often. In some embodiments, some inputs may be considered as critical and need to be address immediately upon a change in value.

Figure 2:
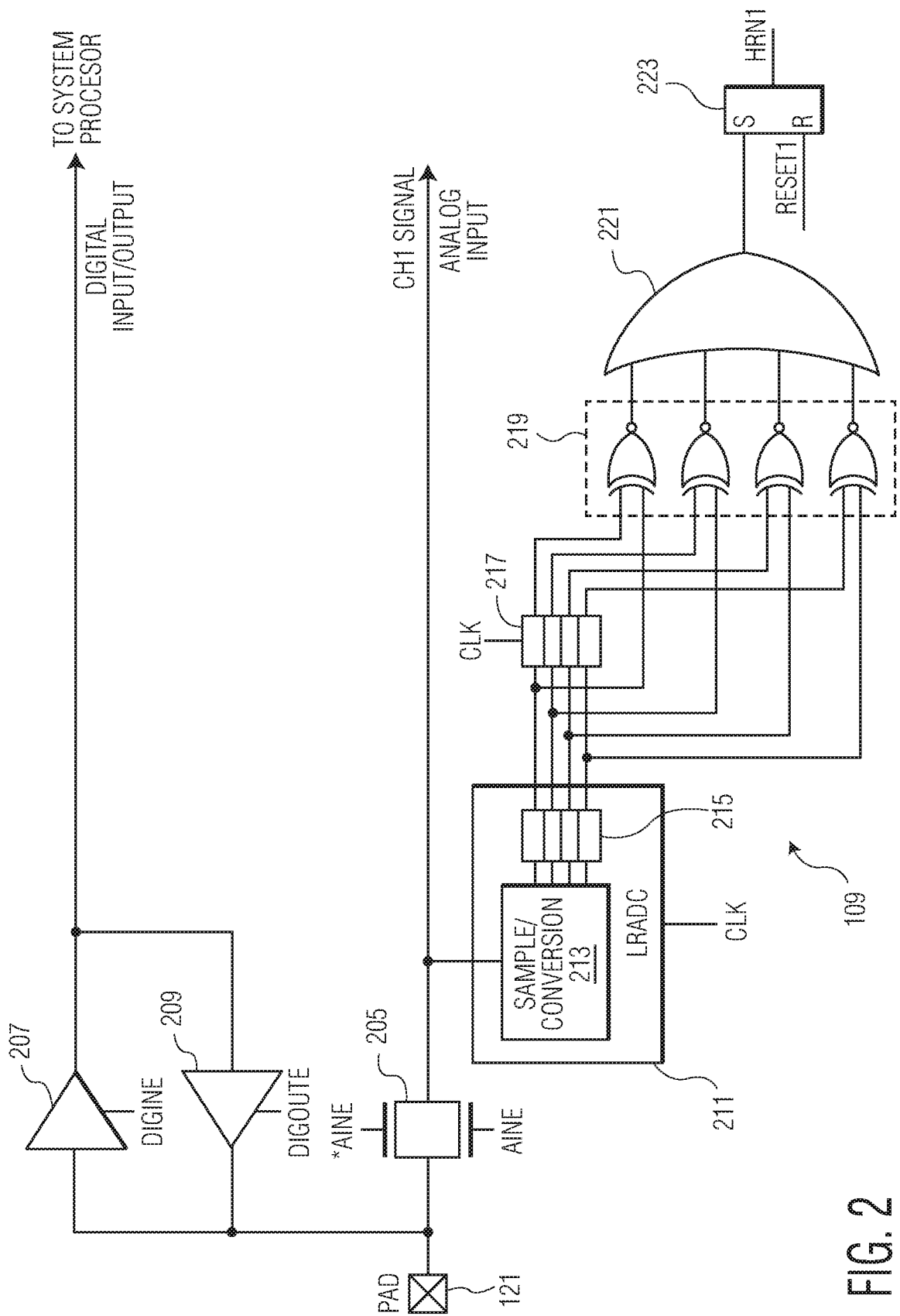
FIG. 2 is a circuit diagram of an I/O circuit according to one embodiment of the present invention.

FIG. 2 is a circuit diagram of I/O cell 109 according to one embodiment of the present invention. In the embodiment shown, cell 109 includes buffer 207 which when activated by digital input enable signal (DIGINE), enables cell 109 to receive a digital input signal from pad 121. The received digital signal is provided to the system processor. Cell 109 includes buffer 209 which when activated by digital output enable signal (DIGOUTE), enables cell 109 to output a digital signal on pad 121. The outputted signal is generated by the system processor.

Cell 109 includes a passgate 205 that includes an NFET and a PFET, which when asserted by the AINE signal, allows cell 109 to receive an analog signal (CH1) and provide that signal to channel mux 105 of FIG. 1. Although not shown, cell 109 may include circuitry that enables it to provide an output analog signal on pad 121. In one embodiment, control signals DIGINE, DIGOUTE, and AINE are provided by the ADC controller 103, but may be provided by other circuitry (e.g. programmable registers, fuses) in other embodiments. In some embodiments, I/O cell 109 does not include buffers 207 and 209 in that it only handles analog signals.

I/O cell 109 includes an LRADC 211, which in the embodiment shown has a conversion resolution of 4 bits. In the embodiment shown, LRADC 211 includes sample/conversion circuit 213 for providing a digital value and a register 215 that latches the digital value every clock cycle of clock signal (CLK). Cell 109 includes circuitry for determining whether the analog signal received at pad 121 has changed in magnitude enough to change the digital output of LRADC 211. In the embodiment shown, cell 109 includes a second register 217 that has inputs coupled to the outputs of register 215 and is responsive to the clock signal (CLK) to clock at its output, the values of the output of register 215 from the previous clock cycle. Cell 109 includes a set 219 of XOR gates with each gate including one input connected to an output of register 215 and the other input connected to the corresponding output of register 217. If any of the outputs change state from one clock cycle to the next, OR gate 221 will provide a high value at its output to set the output (HRN1) of SR flip-flop 223 to high to indicate that the analog signal received at pad 121 has changed in value enough to change the digital output of LRADC 211. The output (HRN1) of flip-flop 223 is reset back to zero upon the assertion of the RESET1 signal form controller 103 in response to HRADC 107 generating a digital output of the analog voltage on pad 121. An I/O circuit may have other configurations in other embodiments including other circuitry arrangements for generating the HRN1 signal. In some embodiments, the output of register 215 may be serially shifted to the system processor if higher conversion resolution of the analog signal is not desired. In some embodiments, the AINE signal (or other signal) may be provided to an enable input of LRADC 211 to turn off the circuitry when not being used.

Figure 3:
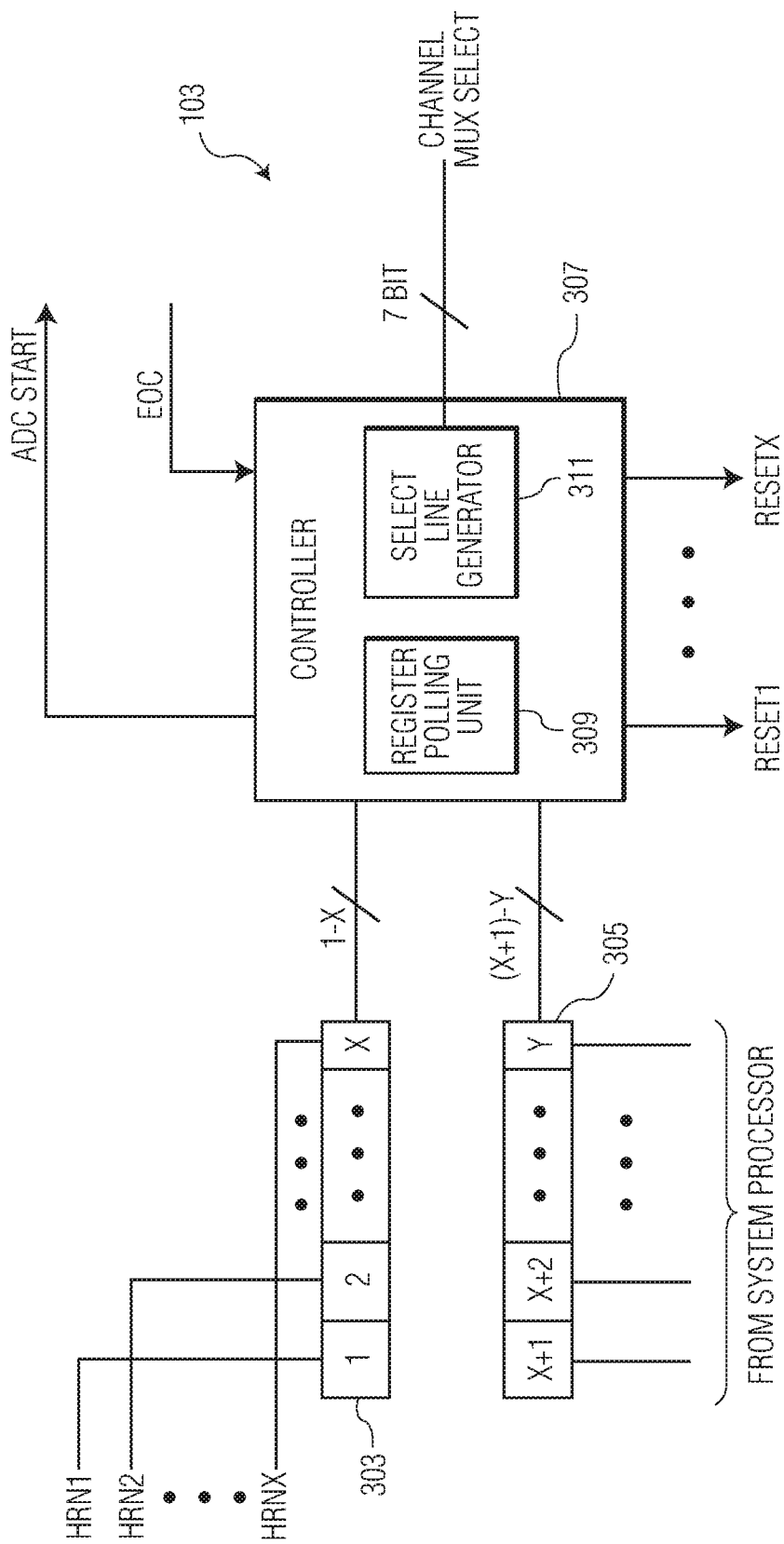
FIG. 3 is a circuit diagram of an ADC controller according to one embodiment of the present invention.

FIG. 3 is a circuit diagram of ADC controller 103 according to one embodiment of the present invention. ADC controller 103 includes a controller circuit 307, register set 303, and register set 305. In the embodiment shown, register set 303 includes a register for each I/O cell (109-111) with a LRADC coupled to mux 105 to store the HRN signal from that cell. Other embodiments do not include register set 303 where controller circuit 307 receives each HRN signal. In the embodiment shown, register set 305 includes a register for each I/O cell (112, 113) coupled to mux 105 that does not include an LRADC. In one embodiment, the registers of set 305 are programmed by the system controller or other circuitry (e.g. registers, fuses). In one embodiment, a "1" is written to the register corresponding to the I/O cell of cells 112-113 when it is desired that the signal received at the external terminal (124-125) of the I/O cell is to be converted to a digital value by HRADC 107.

In the embodiment shown, controller circuit 307 includes a register polling unit 309 that, based on the contents of the registers of sets 303 and 305, selects the next channel whose input analog signals is to be A-D converted by HRADC 107. The select line generator 311 then asserts the appropriate channel mux select lines to mux 105 to provide the analog signal of the selected channel to HRADC 107 for conversion. Controller circuit 307 also provides the ADC START signal and the RESET (1-X) signals and receives the EOC signal from HRADC 107.

In other embodiments, controller 103 can be configured in different ways, include different circuitry, and/or operate in a different manner. For example, in some embodiments, register set 305 may include a register for each I/O cell coupled to mux 105 (including those I/O cells (109-111) with an LRADC). With such an embodiment, each I/O cell can be programmed such that it can be polled for higher resolution digital to analog conversion regardless of whether the value of the LRADC output of the cell has changed. For example, a "1" programmed into the register of set 305 would indicate that the analog input of the corresponding I/O cell is to be converted by HRADC 107 regardless of whether the value of the output of its LRADC has changed. A "0" would indicate that the analog output of the cell is not to be converted unless the value of its LRADC has changed (as indicated by the HRN signal from the particular channel). With such an embodiment, unit 309 would logically AND the contents of the corresponding registers of sets 303 and 305. If either register has a "1", then unit 309 would schedule the output of the cell for digital conversion. In some embodiments where all of the I/O cells (109-113) coupled to mux 105 include an LRADC, each I/O cell would include a register in set 303. In some embodiments, controller 103 would not include register set 305.

Figure 4:
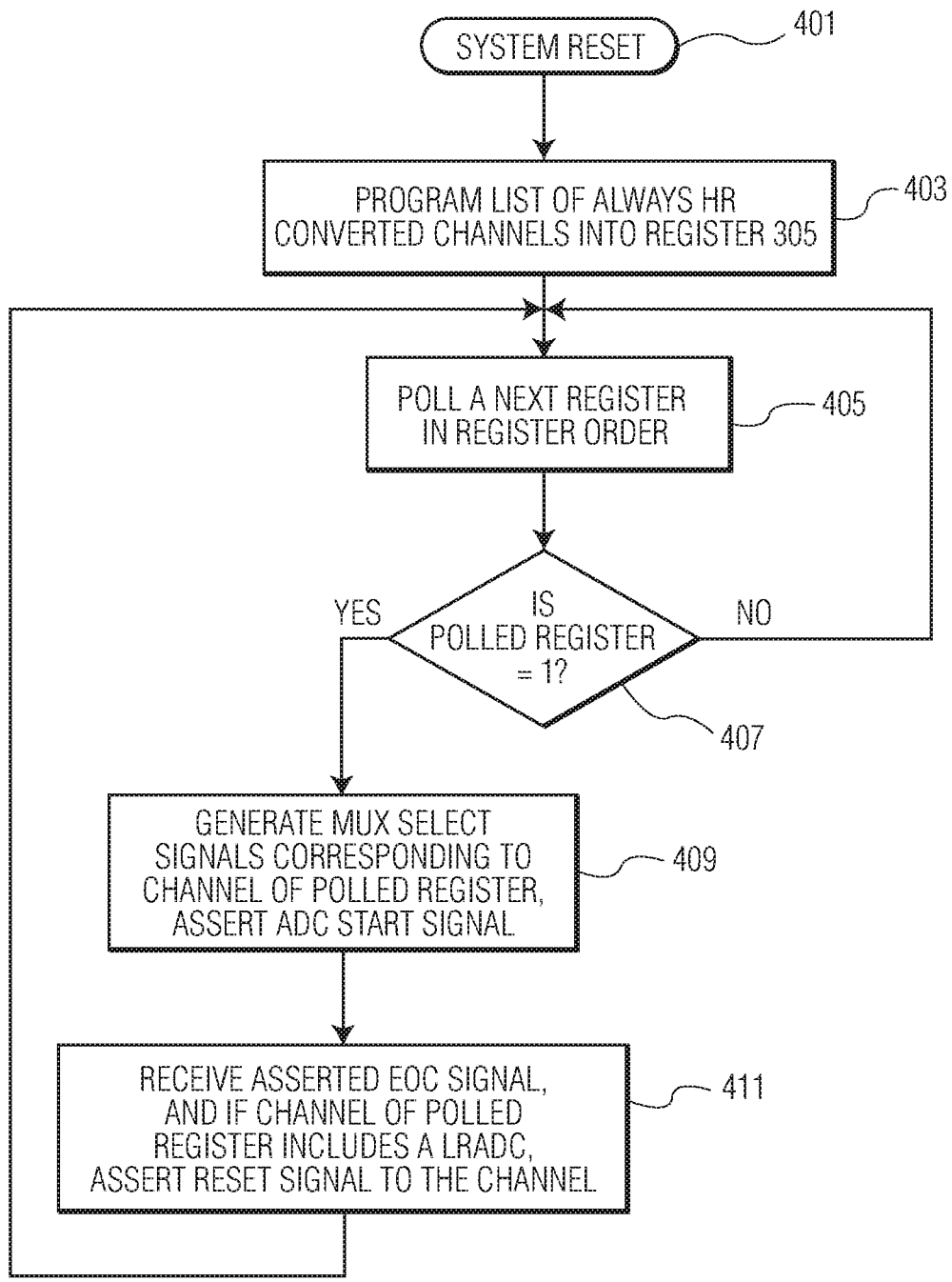
FIG. 4 is a flow diagram showing the operation of ADC circuitry according to one embodiment of the present invention.

FIG. 4 is a flow diagram showing the operation of the circuit of FIG. 1 according to one embodiment. In the embodiment of FIG. 4, controller 103 selects the channels for A-D conversion by HRADC 107 by polling the registers of sets 303 and 305 in an order where the channels without an LRADC (the channels of I/O cells 112-113) are given equal priority as those with an LRADC (the channels of I/O cells 109-111).

In the embodiment shown, in operation 401, the system is reset (such as when the system is started up). In operation 403, a list of channels whose output is always to be converted by HRADC 107 is programmed into register set 305 by writing a "1" into the register of that set corresponding to the channel. In 405, unit 309 polls a first (or next) register to determine whether there is a "1" in that register in decision 407. In one embodiment, the registers of set 303 are polled in order first followed by the registers of set 305, although the order can be switched in other embodiments. In some embodiments where each channel of mux 105 includes a register in each set, the corresponding registers are ORed (or ANDed in some embodiments) to determine whether the output of the analog signal of the channel should be A-D converted by HRADC 107 at that time. If the polled register is determined to be a "1" in decision 407, then the select line generator 311 generates the mux select line signals to select the channel corresponding to the polled register and asserts the ADC START signal in operation 409. Once controller 103 receives the asserted EOC signal indicating that the A-D conversion is complete, it asserts the RESET signal to the channel (if the I/O cell of the channel has an LRADC) in operation 411. The flow then goes back to operation 405 where the next register in the order is polled.

If in decision 407, the polled register bit is "0", then the flow goes back to operation 405 where the next register is polled.

With the embodiment of FIG. 4, if the LRADC of an I/O cell has changed enough to change the digital output of the LRADC, then the analog signal of the channel of the I/O cell will be converted the next time the corresponding register of set 303 is scheduled to be polled.

In one embodiment, for I/O cells with an LRADC, converting the analog signals of only those I/O cells whose analog input signal voltage has changed enough to change the digital output of the LRADC of the cell, may provide in some embodiments for a more efficient system that can spend more system resources (time and power) converting the analog signals that need to be converted and not waste resources converting signals that don't need to be converted. For example, if only half the analog signals need A-D conversion, then the signals that need conversion are monitored twice as often versus systems where each signal is monitored all the time.

In other embodiments, if a polled register for a channel indicates that the HRN signal of the channel indicates no change in the analog signal, controller 103 will idle for the time it would have taken HRADC 107 to do an A-D conversion (e.g. 1 microsecond) of that analog signal. With such a system, power consumption can be reduced in that HRADC 107 only operates when needed.

In some embodiments of FIG. 4, controller circuit 307 includes a counter (not shown) where every count value of the counter corresponds to a channel coupled to mux 105 (e.g. 96 channels). During operation, the counter would continuously run. For each count value, controller circuit 307 would check the register or registers of sets 303 and/or 305 associated with the channel of the count to see if the channel should be A-D converted. If an A-D conversion is indicated for the channel, the counter is stopped, and the counter value is used to provide the mux select signal to mux 105 to select the channel for A-D conversion by HRADC 107. The counter is resumed again in response to controller 103 receiving the asserted EOC signal, where the counter provides the next count value which corresponds to the next channel in the order. If no A-D conversion is scheduled for the channel, then the counter provides the next count value without the counter being stopped.

Figure 5:
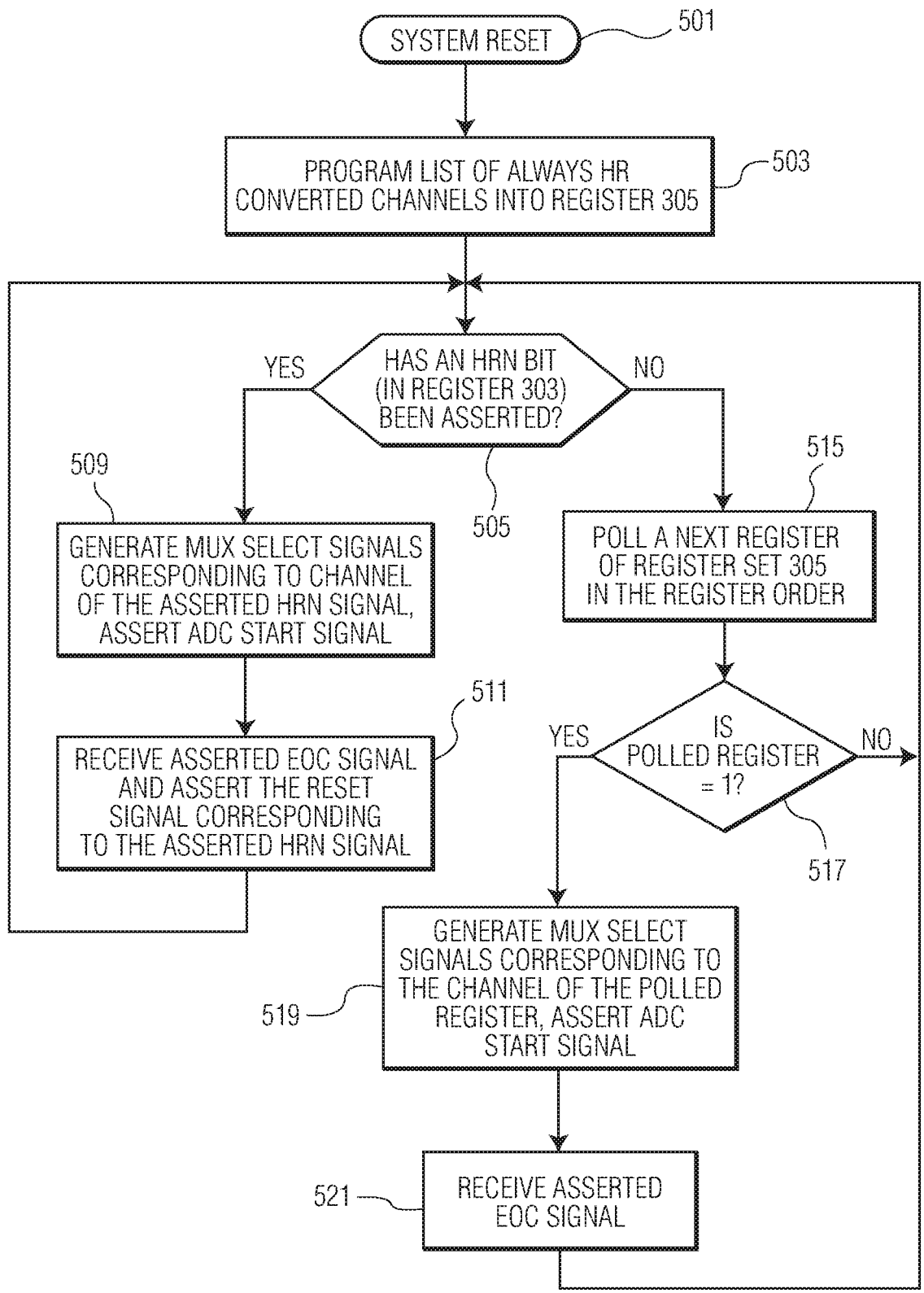
FIG. 5 is a flow diagram showing the operation of ADC circuitry according to another embodiment of the present invention.

FIG. 5 is a flow diagram showing the operation of the circuit of FIG. 1 according to another embodiment of the present invention. In the embodiment of FIG. 5, the HRN signals from the channels of I/O cells 109-111 are treated as interrupts and are given priority over the A-D conversion of the channels of the "always converted" channels of I/O cells 112-113.

After the system is reset in operation 501 and the list of "always converted" channels of I/O cells (112-113) is loaded into register set 305 in operation 503, controller circuit 307 checks register set 303 to see if an HRN signal has been asserted in decision 505. If yes in decision 505, controller circuit 307 generates mux select signals corresponding the channel that generated the HRN signal and asserts the ADC START signal in operation 509. After HRADC 107 performs the A-D conversion, controller circuit 307 receives the asserted EOC signal and asserts the RESET signal corresponding to the channel of the asserted HRN signal in operation 511. Afterwards, the flow goes back to decision 505 to check if any HRN's have been asserted. If no in decision 505, controller circuit 307 polls the next register in register set 305 for the next "always converted" channel in an order in operation 515. If the polled register indicates a "1" in decision 517, then controller circuit 307 generates mux select signals corresponding to the channel of the polled register and asserts the ADC START signal in operation 519. After the A-D conversion of the analog signal by HRADC 107, controller 103 receives the asserted EOC signal from HRADC 107 in operation 521. The flow then proceeds back to decision 505 to determine if there has been any assertion of an HRN signal. Also, in decision 517, if the polled register does not indicate a 1, the flow goes back to decision 505 to determine whether there was an asserted HRN signal.

Accordingly, in the embodiment of FIG. 5, each time the system is finished with an A-D conversion by HRADC 107, controller checks to see if another HRN signal has been asserted, and if so, initiates the A-D conversion of that channel prior to handling the "always converted" channels.

Although FIGS. 4 and 5 set forth two different ways of converting analog signals of multiple channels to digital values, such conversions may be handled in different ways. For example, in some embodiments, the analog signal of a channel is only converted if the HRN signal of the LRADC of the channel indicates a change. in such an embodiment, HRADC 107 would do an initial conversion for each channel received by mux 105. HRADC 107 would only do a subsequent conversion of the channel if the HRN signal indicated that the analog signal voltage has changed by an amount that causes the digital output of the LRADC of the channel to change. In other embodiments, a system could operate in a full power mode where every analog channel is always A-D converted and in a low power mode where only channels with asserted HRN signals are A-D converted. In such an embodiment, the LRADCs may be disabled during the full power mode. In another embodiment that is a variation of FIG. 5, the system would alternate between performing a A-D conversion of an "always converted" channel and a channel with an asserted HRN signal.

As shown above, implementing a system where an analog signal can be A-D converted by a lower resolution ADC and a higher resolution ADC may provide for a system that reduces power in that an analog signal would only be converted by a higher resolution ADC when the change in the analog voltage is large enough to change the output of the lower resolution digital signal. Furthermore, in such embodiments, the system may act as a high frequency filter that ignores small changes in the analog signals. Furthermore, such a system may allow for an increased conversion of other analog signals by the higher resolution ADC in that the higher resolution ADC's operational time is not wasted on analog signals with minor changes. Accordingly, such a system may be able to handle more channels with one HRADC, thereby reducing circuit overhead.

Also, in some embodiment, the results of the LRADC may be compared with the results of the HRADC to allow for full redundancy of the conversion of the analog signal.

In one embodiment, a circuit includes a first external terminal and a first lower resolution analog-to-digital converter (LRADC) and configured to perform a first analog-to-digital (A-D) conversion of a first analog signal received at the first external terminal to a first digital value. The circuit includes a higher resolution analog-to-digital converter (HRADC) configured to selectively receive the first analog signal from the first external terminal based on the first digital value. When the first digital value by the first LRADC indicates a change in value of the first analog signal, the HRADC is configured to receive the first analog signal and perform a second A-D conversion of the first analog signal to a second digital value. The first LRADC has a lower conversion resolution as compared to the HRADC.

In another embodiment, a circuit includes a higher resolution analog-to-digital converter (HRADC) configured to perform an analog-to-digital (A-D) conversion on a selected analog signal. The circuit includes a plurality of channels including a first set of channels. Each channel of the first set of channels includes a corresponding external terminal and a corresponding lower resolution analog-to-digital converter (LRADC). Each corresponding LRADC having a lower A-D conversion resolution than the HRADC and is configured to perform an A-D conversion on an analog signal received at the corresponding external terminal of the each channel. The circuit includes a channel selector coupled between the HRADC and the plurality of channels. An output of the channel selector provides the selected analog signal from a selected channel of the plurality of channels to the HRADC for A-D conversion. The circuit includes a controller coupled to the channel selector and configured to direct the channel selector to select a channel from the first set of channels as the selected channel when an A-D conversion by the corresponding LRADC of the channel indicates a change in value of an analog signal received by the corresponding external terminal of the channel.

In another embodiment, a method includes selecting a first channel from a first set of channels to provide a first analog signal received at a first external terminal of the first channel to a higher resolution analog-to-digital converter (HRADC) for conversion to a first digital value only when a conversion by a corresponding low resolution analog-to-digital converter (LRADC) of the first channel to a second digital value indicates a change in value of the first analog signal. The first digital value has a higher digital resolution than the second digital value. Each channel of the first set of channels includes a corresponding LRADC. The method includes converting the first analog signal to the first digital value by the HRADC in response to the selecting.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A circuit comprising:
    a first external terminal;
    a first lower resolution analog-to-digital converter (LRADC) configured to perform a first analog-to-digital (A-D) conversion of a first analog signal received at the first external terminal to a first digital value;
    a higher resolution analog-to-digital converter (HRADC) configured to selectively receive the first analog signal from the first external terminal based on the first digital value, wherein when the first digital value by the first LRADC indicates a change in value of the first analog signal, the HRADC is configured to receive the first analog signal and perform a second A-D conversion of the first analog signal to a second digital value, wherein the first LRADC has a lower conversion resolution as compared to the HRADC.

2. The circuit of claim 1, wherein the LRADC has a resolution of at most 4 bits for each conversion, and the HRADC has a resolution of at least 8 bits for each conversion.

3. The circuit of claim 1, further comprising:
    a second external terminal, wherein the HRADC performs an A-D conversion of a second analog signal received at the second external terminal, in which performance of the A-D conversion by the HRADC is not based on any lower resolution A-D conversion.

4. The circuit of claim 1, further comprising:

a channel selector coupled to a plurality of channels, each channel includes a corresponding external terminal, a first channel of the plurality of channels includes the first external terminal, the channel selector having an output coupled to the HRADC to provide a selected analog signal from a corresponding external terminal of a selected channel for A-D conversion; and a controller which selects the selected channel to provide the selected analog signal to the HRADC.

5. The circuit of claim 4, wherein the plurality of channels comprises:

a first set of channels, including the first channel, wherein each channel of the first set of channels includes a corresponding LRADC coupled to the corresponding external terminal of the channel, wherein the first channel includes the LRADC as a corresponding LRADC; and a second set of channels wherein each channel of the second set of channels does not include a corresponding LRADC coupled to the corresponding external terminal of the channel.

6. The circuit of claim 5, wherein the controller is configured to direct the channel selector to select a channel from the first set of channels to provide the selected analog signal to the HRADC based on a low resolution (A-D) conversion by the corresponding LRADC of the channel such that a channel from the first set of channels is selected only in response to the corresponding LRDAC of the channel indicating a change in value of a corresponding analog signal received on the corresponding external terminal of the channel.

7. The circuit of claim 6, wherein the controller is further configured to direct the channel selector to select each channel of the second set of channels and each channel of the first set of channels whose LRADC of the channel of the first set has indicated a change in value of the corresponding analog signal, in an order, to provide the selected analog signal of the channel to the HRADC.

8. The circuit of claim 6, in which the controller is configured to direct the channel selector to select each channel of the second set of channels, in an order, to provide the selected analog signal to the HRADC independent of any lower resolution (A-D) conversion of the selected analog signal.

9. The circuit of claim 5, wherein the controller provides priority to a channel in the first set of channels to be selected by the channel selector whose corresponding LRADC detects a change in value in a corresponding analog signal over any channel in the second set of channels.

10. A circuit comprising:

a higher resolution analog-to-digital converter (HRADC) configured to perform an analog-to-digital (A-D) conversion on a selected analog signal;

a plurality of channels including a first set of channels wherein:

each channel of the first set of channels includes a corresponding external terminal and a corresponding lower resolution analog-to-digital converter (LRADC), each corresponding LRADC having a lower A-D conversion resolution than the HRADC and is configured to perform an A-D conversion on an analog signal received at the corresponding external terminal of the each channel, and a channel selector coupled between the HRADC and the plurality of channels, wherein an output of the channel selector provides the selected analog signal from a selected channel of the plurality of channels to the HRADC for A-D conversion; and a controller coupled to the channel selector and configured to direct the channel selector to select a channel from the first set of channels as the selected channel when an A-D conversion by the corresponding LRADC of the channel indicates a change in value of an analog signal received by the corresponding external terminal of the channel.

11. The circuit of claim 10, wherein:

the plurality of channels includes a second set of channels wherein each channel of the second set of channels includes a corresponding external terminal;

the controller is configured to direct the channel selector to select each channel from the second set of channels, in an order, as the selected channel.

12. The circuit of claim 11, wherein each channel from the second set of channels is selected without being based on any lower A-D resolution conversion.

13. The circuit of claim 11, wherein the controller provides priority to a channel of the first set of channels to be selected by the channel selector whose corresponding LRADC detects a change in value in an analog signal received at its corresponding external terminal over any channel of the second set of channels.

14. The circuit of claim 13, wherein the controller is configured to continue selecting, in an order, each channel from the second set of channels when there are no channels of the first set of channels whose corresponding LRADC detects a change in value of an analog signal received at its corresponding external terminal.

15. The circuit of claim 10, wherein each channel provides an indication to the controller that an A-D conversion by the corresponding LRADC of the channel indicates a change in value of an analog signal received by the corresponding external terminal of the channel, the controller is further configured to, in response to a completion of a higher resolution A-D conversion by the HRADC of a selected analog signal from a selected channel of the first set of channels, reset the indication of selected channel.

16. The circuit of claim 10, wherein each LRADC has a conversion resolution of at most 4 bits, and the HRADC has a conversion resolution of at least 8 bits.

17. The circuit of claim 10, wherein the channel selector comprises a multiplexer controlled by channel multiplexor select signals from the controller to select the selected analog signal from the selected channel.

18. A method comprising:

selecting a first channel from a first set of channels to provide a first analog signal received at a first external terminal of the first channel to a higher resolution analog-to-digital converter (HRADC) for conversion to a first digital value only when a conversion by a corresponding low resolution analog-to-digital converter (LRADC) of the first channel to a second digital value indicates a change in value of the first analog signal, wherein the first digital value has a higher digital resolution than the second digital value, wherein each channel of the first set of channels includes a corresponding LRADC;

converting the first analog signal to the first digital value by the HRADC in response to the selecting.

19. The method of claim 18, further comprising:

selecting each channel from a second set of channels, in an order, to provide to a corresponding analog signal received at a corresponding external terminal of the channel to the HRADC for conversion to a corresponding digital value, in which the selection for performance of the conversion to the corresponding digital value is not based on any lower resolution conversion;

converting the corresponding analog signals to digital values by the HRADC in response to the selecting each channel of the second set.

20. The method of claim 19, wherein:

the selecting a first channel from a first set of channels and the selecting each channel from the second set of channels is performed such that any selected channel from the first set of channels has higher priority than the channels from the second set of channels when a digital value from a corresponding LRADC of a channel of the first set indicates a change in value of a received analog signal from a previous digital value from the corresponding LRADC of the channel of the first set, the selecting the first channel interrupts the order of the selecting each channel from the second set of channels.

* * * * *